United States Patent [19]

Haefner et al.

[11] Patent Number: 5,699,014

[45] Date of Patent: Dec. 16, 1997

[54] LINEAR AMPLIFIER

[75] Inventors: Paul A. Haefner, Circle Pines; William J. Linder, Golden Valley, both of Minn.

[73] Assignee: Cardiac Pacemakers, Inc., St. Paul, Minn.

[21] Appl. No.: 627,403

[22] Filed: Apr. 4, 1996

[51] Int. Cl.[6] .................................................. H03F 3/45
[52] U.S. Cl. ........................ 330/253; 330/256; 330/261; 128/696
[58] Field of Search ............................ 128/696; 330/253, 330/256, 261

[56] References Cited

U.S. PATENT DOCUMENTS

| | | | |
|---|---|---|---|
| 3,926,197 | 12/1975 | Alley, III | 128/419 PT |
| 3,983,880 | 10/1976 | Kolenik | 128/419 PG |
| 3,999,556 | 12/1976 | Alferness | 128/419 PG |
| 4,059,116 | 11/1977 | Adams | 128/419 PG |
| 4,097,766 | 6/1978 | Renirie | 307/229 |
| 4,202,341 | 5/1980 | Blaser | 128/419 PG |
| 4,513,212 | 4/1985 | Money | 307/575 |
| 4,959,621 | 9/1990 | Hosticka et al. | 330/261 X |
| 5,336,242 | 8/1994 | Zadeh | 607/11 |
| 5,425,748 | 6/1995 | Pless | 607/5 |
| 5,435,316 | 7/1995 | Kruse | 128/697 |
| 5,456,263 | 10/1995 | Andersen | 128/696 X |

*Primary Examiner*—Steven Mottola
*Attorney, Agent, or Firm*—Schwegman, Lundberg, Woessner & Kluth, P.A.

[57] ABSTRACT

A low-noise, low-power complementary metal-oxide-semiconductor (CMOS) integrated circuit common source differential amplifier is disclosed which is capable of amplifying low amplitude cardiac signals such as those produced by atrial depolarization of the heart. The amplifier has a pair of large area p-channel input field-effect transistors (FETs) biased in weak inversion. The amplifier also has active load FETs biased in the nonsaturation (linear) region by means of a varying gate terminal voltage applied by a dynamic bias circuit. The gate terminal voltage is varied to match the temperature dependence of the output conductance of the load FETs to the temperature dependence of the transconductance of the input FETs. The gate terminal voltage also sets a dc bias point which uses the nonlinearity in the load FET output conductance to cancel nonlinearity in the input FET transconductance.

24 Claims, 4 Drawing Sheets 5,699,014

LINEAR AMPLIFIER

THE FIELD OF THE INVENTION

The present invention relates to semiconductor integrated circuits and, more particularly, to implementation of an analog complementary metal-oxide-semiconductor (CMOS) low power low noise amplifier circuit suitable for use in an implantable cardiac rhythm management system.

BACKGROUND OF THE INVENTION

A critical aspect of signal processing concerns the acquisition of the signal itself. Circuits which interface to the signal source demand high input impedance and low noise performance. High input impedance prevents perturbation or attenuation of the signal being acquired. The electronic noise contributed by the circuit itself must be minimized to allow detection of small amplitude signals.

For example, preamplification circuits are needed for acquisition of low amplitude, low frequency biological signals such as electrical depolarization signals produced by heart atrium upon contraction. Such signals can have amplitudes between 3 and 5 millivolts and frequencies between 10 and 20 Hertz.

A differential amplifier with resistive loads (FIG. 1) provides a simple circuit topology for preamplification of small amplitude signals. Such an amplifier comprises field-effect transistors (FETs) having drain, gate, and source terminals. Matched FETs 100 and 105 are connected with common source terminal V100 and supplied by a bias current generator 110. The drain terminal of FET 105 is connected to resistive load 125 at node V115. The drain terminal of FET 100 is connected to a resistive load 120 at node V120. Each resistive load 120 and 125 is connected to ground potential at node V102. A differential input voltage signal applied between gate terminal at V105 of FET 100 and the gate terminal at V110 of FET 105 causes a differential current signal through load resistors 120 and 125 which causes a differential output voltage signal between V115 and V120.

The differential amplifier topology shown in FIG. 1 has a high input impedance at its inputs at V105 and V110, due to the high gate terminal input impedance of FET 100 and FET 105 respectively. Thus, this topology is well suited to amplifying low amplitude biological signals without attenuation. But this topology also has several drawbacks which makes such amplification very difficult.

First, the electronic noise contributed by metal-oxide-semiconductor (MOS) devices includes a flicker noise (1/f noise) component which increases as the frequencies of interest are decreased. The biological signals of interest are at very low frequencies (10 to 20 Hz).

Second, the differential amplifier of FIG. 1 uses resistors 120 and 125 as load devices, requiring significant integrated circuit die area. This problem can be overcome by using FETs as "active loads".

One possible implementation of a differential amplifier using FETs as active loads is shown in FIG. 2. In FIG. 2, the load resistors 120 and 125 of FIG. 1 are replaced by matched "diode-connected" load FETs 200 and 205. Load FET 200 is diode connected by connecting its gate and drain terminals at common node V120. Similarly, load FET 205 is diode connected by connecting its gate and drain terminals at common node V115. This topology has several disadvantages including poor voltage gain and linearity, explained below.

First, the voltage gain is determined by a ratio of a transconductance ($g_m$) of input FET 100 to the transconductance of diode-connected load FET 200. For low-power applications, the FETs are desired to operate in a "weak inversion" region (also called subthreshold region). In weak inversion, the transconductance $g_m$ of the FET is determined by physical constants, device constants, and current through the FET. Since the same current flows through input FET 100 and diode-connected load FET 200, the ratio of the input and load transconductances is close to unity, providing little voltage gain.

Second, a linear transfer characteristic (linearity) is desired for undistorted signal amplification. The linearity of the amplifier of FIG. 2 is not as good as the linearity of the resistive load amplifier of FIG. 1. While the resistive loads 120 and 125 have a linear current vs. voltage characteristic, the diode-connected load FETs 200 and 205 only approximate linear loads for small signals. For a sufficiently large differential input voltage between V105 and V110, one of the diode-connected active load FETs 200 and 205 may enter its cutoff region of operation. This introduces significant nonlinearity in the signal amplification.

Another common active load implementation uses a current mirror, as shown in FIG. 3. In FIG. 3, the load resistors 120 and 125 of FIG. 1 are replaced by load FET 305 and diode-connected load FET 300. Load FET 300 is diode connected by connecting its gate and drain at common node V300. This biases load FET 300 in its saturation region of operation, and since load FET 305 shares a common gate with load FET 300 at V300, load FET 305 is biased in the saturation region as well. The topology of FIG. 3 also has several drawbacks.

First, operation of load FETs 300 and 305 in the saturation region makes their load resistances high. These high resistances provide a high voltage gain, but also add greater thermal electronic noise contribution. The high voltage gain is unpredictable since it depends on the output conductance ($g_{ds}$) of the load FET 305, which is sensitive to process variations in the saturation region of operation. Second, the topology of FIG. 3 requires a single-ended output voltage at V115. Third, the high voltage gain reduces the maximum detectable input signal amplitude for which linear amplification is obtained.

Thus, there is a substantial need for a low-power, low-noise amplifier with well-controlled and linear voltage gain, high input impedance, and wide dynamic range. Such an amplifier would be well suited for use as a signal acquisition preamplifier to a signal processing system such as a switched-capacitor filter.

SUMMARY OF THE INVENTION

The present invention implements an integrated circuit amplifier. The amplifier comprises a differential pair of input field-effect transistors (FETs) receiving a differential input voltage signal. The differential input voltage signal has a first input signal component and a second input signal component. In response to the differential input signal, the amplifier provides a differential output voltage signal. The output voltage signal has a first output signal component and a second output signal component. The differential pair of input FETs includes a first input FET having a source terminal, a gate terminal receiving the first input signal component, and a drain terminal providing the first output signal component, and a second input FET having a source terminal coupled to the source terminal of the first input FET, a gate terminal receiving the second input signal component, and a drain terminal providing the second output signal component. A first load FET has a source terminal, a gate terminal, and a drain terminal. The drain terminal of the first load FET is coupled to the drain terminal of the first input FET, and a controlled conductance between the drain terminal and the source terminal. A second load FET has a source terminal coupled to the source terminal of the first load FET, a gate terminal coupled to the gate terminal of the first load FET, a drain terminal coupled to the drain terminal of the second input FET, and a controlled conductance between the drain terminal and the source terminal. A dynamic bias circuit is coupled to the gate terminals of the first and second load FET. The dynamic bias circuit keeps the first and second load FETs in a nonsaturation region and controls the conductance between the drain terminal and the source terminal of each of the first and second load FETs by applying a varying bias voltage to the gate terminals of each of the first and second load FETs.

In one embodiment, the amplifier uses large area PMOS input FETs biased in a weak inversion region resulting in low input-referred flicker noise.

The dynamic bias circuit provides a gate voltage to the load FETs to control their output conductance. The dynamic bias circuit varies the gate voltage so as to match the temperature dependence of the load FET output conductance to the input FET transconductance, thereby producing an approximately temperature independent differential voltage gain. The dynamic bias circuit also sets the dc bias point of the amplifier load FETs such that nonlinearity in the load FET output conductance is used to cancel a portion of the nonlinearity of the transconductance characteristic of the differential input FETs.

In one embodiment, a single-ended dynamic bias circuit is disclosed which uses a single replicate FET to substantially duplicate the load FETs of the linear amplifier. A proportional to absolute temperature (PTAT) bias current is received at the drain terminal of the replicate FET. A PTAT drain-to-source voltage is also received by the replicate FET. The resulting gate terminal voltage of the replicate FET is used to bias the gate terminals of the amplifier load FETs.

In another embodiment, a differential dynamic bias circuit is disclosed which uses a first replicate FET and a second replicate FET, each of which substantially duplicate the load FETs of the linear amplifier. PTAT currents of different magnitudes are received at the drain terminals of the first and second replicate FETs, and a PTAT voltage is received between the drain terminals of each replicate FET. The common gate terminal of the first and second replicate FET is used to bias the gate terminal of the amplifier load FETs.

Thus, the present invention provides an apparatus and method for implementing a low power, low noise, high input impedance linear amplifier circuit suitable for detection of low amplitude electrical signals such as those produced by atrial depolarization of the heart.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention uses a low-power, low-noise amplifier with well-controlled and linear voltage gain, high input-impedance, and wide dynamic range, suitable as a preamplifier to a signal processing system, such as a switched-capacitor filter. One application for which the present invention is particularly well suited is for amplification of the electrical signals in the heart produced by atrial depolarization.

Figure 1:
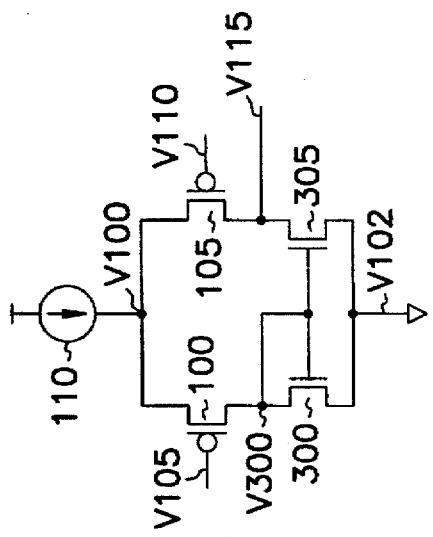
FIG. 1 illustrates a differential amplifier with resistive loads.
Figure 2:
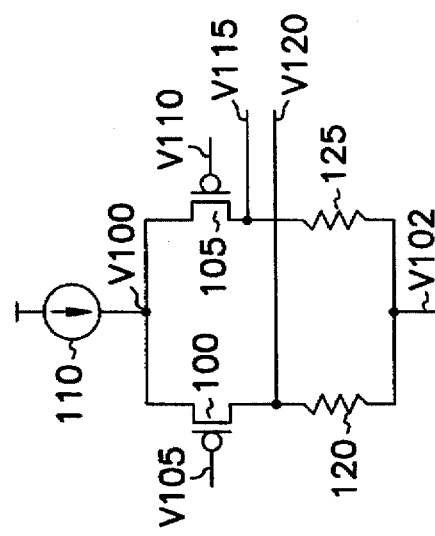
FIG. 2 illustrates a differential amplifier with resistive loads implemented by diode-connected field-effect transistors (FETs).
Figure 3:
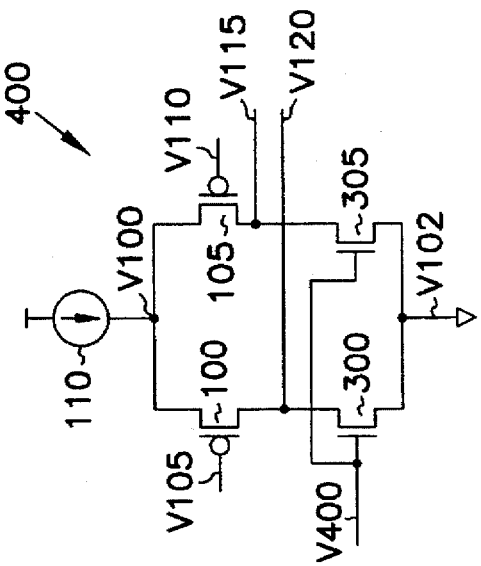
FIG. 3 illustrates a differential amplifier with current mirror loads.
Figure 4:
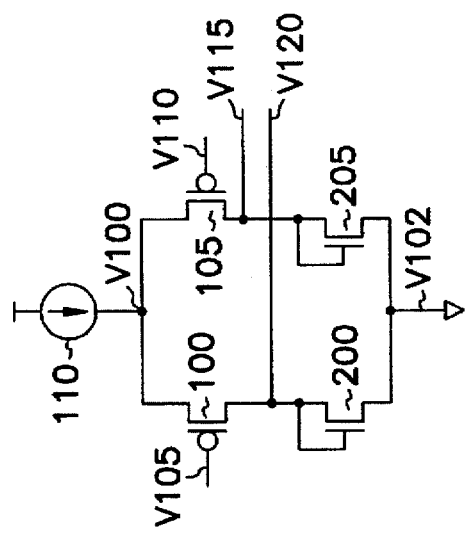
FIG. 4 illustrates a differential amplifier with load FETs operating region determined by a common gate bias voltage.

A portion of an integrated circuit amplifier is illustrated generally at 400 in FIG. 4. Such an amplifier comprises field-effect transistors (FETs) having drain, gate, and source terminals. Matched first and second input FETs 100 and 105 respectively have common source terminals at node V100 receiving current from a bias current generator 110. The drain terminal of FET 100 is connected to first load FET 300 at node V120. The drain terminal of FET 105 is connected to second load FET 305 at node V115. The first and second load FETs have common source terminals connected to ground at node V102, and common gate terminals at node V400. A differential input voltage signal applied between the gate terminal at node V105 of first input FET 100 and the gate terminal at node V110 of second input FET 105 causes a differential current signal through first and second load FETs 300 and 305 which causes a differential output voltage signal between nodes V115 and V120.

The portion of an integrated circuit amplifier illustrated in FIG. 4 uses an external bias network (shown in FIG. 5) coupled to node V400 at the common gate terminals of first and second load FETs 300 and 305. In conventional usage, the first and second load FETs are biased in the saturation region of operation. This conventional implementation obtains a differential output voltage between nodes V115 and V120. This conventional implementation, however, still exhibits problems typical to load devices biased in saturation: excessive and uncontrolled gain, low maximum detectable input signal, and high electronic noise contribution.

In one embodiment of the present invention, the circuit of FIG. 4 is modified from conventional usage to produce desirable results. First, the first and second input FETs 100 and 105 are implemented as p-channel metal-oxide-semiconductor (PMOS) FETs, since PMOS FETs have a lower flicker noise (1/f) noise component than n-channel (NMOS) FETs. First and second input FETs 100 and 105 have large gate areas to reduce the flicker noise contributed by these first and second input FETs 100 and 105. In one embodiment, a sum of the gate areas for both first and second input FETs 100 and 105 is at least 50,000 square microns, which is sufficient to obtain an total input-referred electronic noise voltage of less than 6 microvolts rms over the frequency range between 0.1 Hz and 500 Hz. This noise voltage is substantially due to the total electronic noise voltage of the first and second input FETs 100 and 105. As explained below, first and second load FETs 300 and 305, which are biased in a nonsaturation (also called linear or triode) region of operation, contribute a negligible portion of this noise in comparison with the first and second input FETs 100 and 105.

In this embodiment, first and second input FETs 100 and 105 are biased in a weak inversion (also called subthreshold) region of operation. In the weak inversion region, a transconductance ($g_m$) of each of the first and second input FETs is represented by:

$$g_m = \frac{I_{ds}q}{nkT} \quad (I)$$

where $I_{ds}$ is a drain source bias current magnitude; n is a physical device constant called a slope factor; k is Boltzman's constant; T is absolute temperature in degrees Kelvin; and q is an electron's charge magnitude. The product of the FET transconductance ($g_m$) and a FET small-signal input voltage between the gate and source terminals ($v_{gs}$) determines a small-signal current flowing between the drain and source terminals of the FET. As represented in Equation (I), the transconductance of the input FET biased in weak inversion is inversely proportional to absolute temperature.

In this embodiment, first and second load FETs 300 and 305 are biased in a nonsaturation region of operation. This is in contrast to the conventional implementation described above where the load FETs are biased in the saturation region. Several advantages are realized by biasing the first and second load FETs 300 and 305 in the nonsaturation region. A small-signal drain-to-source resistance of the first and second load FETs 300 and 305 is lower in the nonsaturation region than in the saturation region. Since electronic noise contributed by a resistive element is proportional to its resistance value, the electronic noise contribution of the first and second load FETs 300 and 305 is decreased by operating the first and second load FETs 300 and 305 in the nonsaturation region instead of the saturation region. An overall voltage gain is also reduced. The magnitude of the voltage gain of the amplifier of FIG. 4 is represented by:

$$\frac{v_o}{v_i} = \frac{g_m}{g_{ds}} \quad (II)$$

In Equation II, $v_o$ is the differential output voltage between nodes V115 and V120; $v_i$ is the differential input voltage applied between nodes V105 and V110; $g_m$ is the transconductance of one of first and second input FETs 100 and 105; and $g_{ds}$ is an output conductance (inverse of the output resistance) of one of first and second load FETs 300 and 305.

In the conventional implementation, this amplifier voltage gain varies with temperature due to different temperature dependencies of transconductance $g_m$ and output conductance $g_{ds}$. The present invention adjusts the voltage at node V400 with a dynamic bias circuit such that output conductance $g_{ds}$ has approximately the same temperature dependence as transconductance $g_m$ to preserve a constant amplifier voltage gain in spite of temperature variations.

Figure 5:
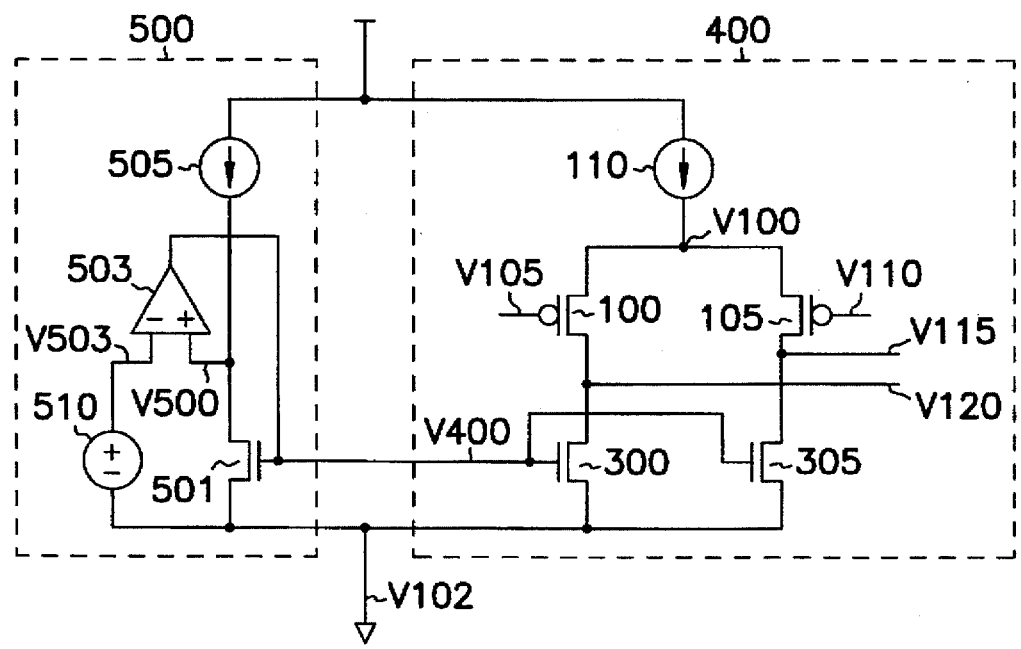
FIG. 5 illustrates the differential amplifier of FIG. 4 with a schematically illustrated bias network for biasing the common gate terminal of the load FETs.

In FIG. 5, one embodiment of the dynamic bias circuit is schematically illustrated generally at 500. Dynamic bias circuit 500 provides a dynamic bias voltage at node V400 for the gate terminals of the first and second load FETs 300 and 305 of the amplifier of FIG. 4. This embodiment of the dynamic bias circuit 500 comprises a replicate FET 501 which duplicates the matched first and second load FETs 300 and 305. The source terminal of replicate FET 501 is coupled to the source terminals of each of the first and second load FETs 500 and 305 which are held at ground voltage potential at node V102. The gate terminal of replicate FET 501 is coupled to the gate terminals of each of first and second load FETs 300 and 305. The source terminal of replicate FET 501 is coupled to ground at node V102.

In the embodiment of FIG. 5, bias current source 505 replicates bias current source 110. In this embodiment, both current sources 505 and 110 supply a current proportional to absolute temperature (PTAT). When identical voltages are applied to the gate terminals at nodes V105 and V110 of input FETs 100 and 105, the current in FETs 100, 105, 300, 305, 501 are substantially identical and proportional to absolute temperature. A voltage bias source V510 provides a PTAT voltage coupled to the inverting input terminal of biasing amplifier 503 at node V503. The drain terminal of replicate FET 501 is coupled to the noninverting input terminal of biasing amplifier 503 at node V500. The output terminal of biasing amplifier 503 is coupled to the common gate terminals of each of first and second load FETs 300 and 305 and of replicate FET 501.

In FIG. 5, the magnitude of the current source 505 and the voltage source 510 are chosen such that replicate FET 501 operates in the nonsaturation region. In this nonsaturation region, the output conductance $g_{ds}$ of replicate FET 501 is approximately constant. The output conductance $g_{ds}$ of a FET is represented by the following equation:

$$g_{ds} = \frac{I_{DS}}{V_{DS}} \quad (III)$$

In Equation III, $I_{DS}$ is a dc current between the drain terminal and the source terminal of the FET; and $V_{DS}$ is a dc voltage between the drain terminal and the source terminal of the FET. When biased as illustrated in FIG. 5, the output conductance of replicate FET 501 is set by the ratio of the PTAT voltage to the PTAT current, where the PTAT voltage is provided by PTAT voltage source 510 and the PTAT current is provided by PTAT current source 505. This forces an approximately constant output conductance $g_{ds}$ for replicate FET 501.

In the nonsaturation region, an operating point is determined by any two of the three dc bias parameters. For example, by providing a dc bias voltage between the gate and source terminals of the FET, and also providing a dc bias current at the drain terminal of the FET, an operating voltage is established at the drain terminal of the FET. Similarly, by providing a dc bias voltage between the drain and source terminals of a FET and also providing a dc bias current at the drain terminal of the FET, an operating voltage at the gate terminal of the FET is established as described below.

A dc PTAT bias current is provided at the drain terminal at node V500 of replicate FET 501. When implemented in the negative feedback configuration shown in FIG. 5, the biasing amplifier 503 has a virtual short circuit property, resulting in a voltage difference between the inverting input terminal at node V503 of biasing amplifier 503 and the noninverting input terminal at node V500 which is approximately zero. This virtual short circuit property is used to couple the dc PTAT bias voltage source 510 at the inverting input terminal of biasing amplifier 503 to the drain terminal at V500 of replicate FET 501. The output of biasing amplifier 503 establishes the proper gate voltage of replicate FET 501 at node V400 which is required to maintain the drain voltage and current bias conditions already established as described above.

Since the resulting voltage at the gate terminal of replicate FET 501 at node V400 was determined from a PTAT voltage between the drain terminal of replicate FET 501 at node V500 and a PTAT drain current through replicate FET 501, the output conductance $g_{ds}$ of replicate FET 501 remains constant over temperature variations. This resulting voltage at node V400 provides a dynamic bias voltage at the common gate terminals of each of the first and second load FETs 300 and 305 at node V400. The dc PTAT bias current source 505 providing current at the drain terminal of replicate FET 501 substantially duplicates the dc PTAT bias current source 110 supplying substantially the same dc PTAT bias current to each of the first and second load FETs 300 and 305. Thus, the dc voltages at nodes V120 and V115, coupled to the drain terminals of first and second load FETs 300 and 305 respectively, are determined by the other dc bias parameters: the common gate voltage of first and second load FETs 300 and 305 at node V400 and the dc current received at the drain terminals of first and second load FETs 300 and 305 at nodes V120 and V115 respectively. As described above for the replicate FET 501, each of the first and second load FETs 300 and 305 are biased with a PTAT drain current received at nodes V120 and V115 respectively, and a common temperature compensated gate voltage at node V400. As a result of these dc bias parameters, the output conductance $g_{ds}$ of each of first and second load FETs 300 and 305 is substantially constant over temperature variations.

Since the $I_{ds}$ of the input FETs 100 and 105 is also proportional to absolute temperature, the transconductance $g_m$ of the input FETs 100 and 105 is approximately temperature independent, as indicated by Equation (1). Since the amplifier voltage gain of the differential amplifier depends on the ratio of transconductance $g_m$ of one of the first and second input FETs 100 and 105 to output conductance $g_{ds}$ of one of the first and second load FETs 300 and 305, both of which are approximately constant over temperature, the resulting amplifier voltage gain will also be approximately constant over temperature.

In one embodiment, substantially identical currents are provided by current bias sources 505 and 110, and the replicate FET 501 duplicates first and second load FETs 300 and 305. However, it is recognized that FET devices are scalable by choosing the width and length parameters of the FET, or by a parallel connection of multiple FETs. It is also recognized that the replicate FET 501 need not be an exact duplicate of the load FET 300 and 305. Rather, replicate FET 501 can be physically scaled in size from the first and second load FETs 300 and 305, and the current produced by current source 505 can be scaled from the current source 110 as well. Such scaling does not in any way alter the inventive concept disclosed herein; it allows the circuit designer an added degree of freedom.

In the above described embodiment of FIG. 5, current bias sources 505 and 110 provide a proportional to absolute temperature (PTAT) current. However, it is recognized from the above Equations (I), (II), and (III) for transconductance $g_m$, output conductance $g_{ds}$, and voltage gain $v_o/v_i$, that current bias sources 505 and 110 need not provide a PTAT current. It is adequate that current bias sources 505 and 110 have substantially the same temperature dependence characteristics.

Figure 6:
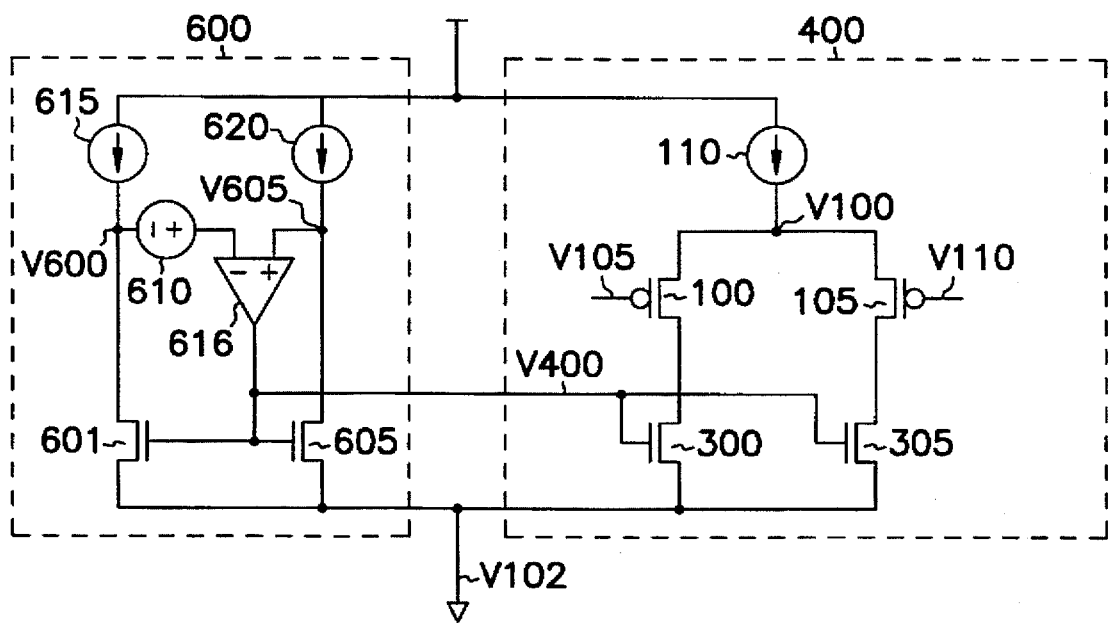
FIG. 6 illustrates the differential amplifier of FIG. 4 with a schematically illustrated differential bias network for biasing the common gate terminal of the load FETs.

FIG. 6 illustrates an embodiment comprising a differential dynamic bias circuit 600. First replicate FET 601 and second replicate FET 605 are duplicate or scaled replicates of load FETs 300 and 305. The first and second replicate FETs 601 and 605 each have source terminals connected to ground voltage potential at node V102 and gate terminals connected to each other at node V400 and to the common gate terminals of the first and second load FETs 300 and 305.

In FIG. 6, PTAT voltage source 610 provides a PTAT voltage difference ($\Delta V_{PTAT}$) between a drain terminal at node V600 of first replicate FET 601 and an inverting input terminal of biasing amplifier 616. A noninverting input of biasing amplifier 616 is connected to a drain terminal of a second replicate FET 605 at node V605. An output of biasing amplifier 616 is connected to common gate terminals of FETs 601, 605, 300, and 305.

In FIG. 6, PTAT current source 110 is replicated by a first scaled PTAT current source 615 providing a first PTAT current at the drain terminal at node V600 of first replicate FET 601. PTAT current source 110 is also replicated by a second scaled PTAT current source 620 providing a second PTAT current at the drain terminal at node V605 of second replicate FET 605. First and second scaled PTAT current source 615 and 620 are each scaled from PTAT current source 110 by different scaling factors, causing the magnitude of the second scaled PTAT current to exceed the magnitude of the first scaled PTAT current. Thus, a differential current ($\Delta I_{PTAT}$) is created between the first scaled current provided to the drain terminal of first replicate FET 601 at node V600 and the second scaled current provided to the drain terminal of the second replicate FET 605 at node V605. Since the currents supplied to each of the first and second replicate FETs are PTAT, the resulting differential current $\Delta I_{PTAT}$ is also PTAT.

The differential dynamic bias circuit 600 operates analogously to the single-ended dynamic bias circuit 500 (shown in FIG. 5). The PTAT voltage difference, $\Delta V_{PTAT}$, between the drain terminal of first replicate FET 601 at node V600 and the drain terminal of second replicate FET 605 at node V605 is provided by PTAT voltage source 610 and the voltage across the inputs of amplifier 615. As will be shown below, negative feedback is used to keep the voltage across the inputs of amplifier 615 approximately equal to zero, such that the PTAT voltage provided by PTAT voltage source 610 is substantially duplicated between the drain terminal of first replicate FET 601 at node V600 and the drain terminal of second replicate FET 605 at node V605. The differential current $\Delta I_{PTAT}$ between the first and second replicate FETs 601 and 605, and the voltage difference $\Delta V_{PTAT}$ between the drain terminals at nodes V600 and V605 of first and second replicate FETs 601 and 605 respectively, creates a differential output conductance $\Delta g_{ds}$ between the first and second replicate FETs 601 and 605 represented by:

$$\Delta g_{ds} = \frac{\Delta I_{DS}}{\Delta V_{DS}} = \frac{\Delta I_{PTAT}}{\Delta V_{PTAT}} \qquad (IV)$$

Since the differential output conductance $\Delta g_{ds}$ between first and second replicate FETs 601 and 605 is determined from a ratio of two PTAT terms, $\Delta I_{PTAT}$ and $\Delta V_{PTAT}$, this differential output conductance $\Delta g_{ds}$ is substantially independent of temperature. Since the differential output conductance $\Delta g_{ds}$ between the first and second replicate FETs 601 and 605 is substantially independent of temperature, the output conductance $g_{ds}$ of each of the first replicate FET 601 and the second replicate FET 605 is substantially temperature independent as well.

In FIG. 6, biasing amplifier 616 adjusts the gate voltage at node V400 of the first and second replicate FETs 601 and 605 respectively to maintain the operating point of the differential dynamic bias circuit 600 such that the output conductance $g_{ds}$ of each of the first and second replicate FETs 601 and 605 is approximately independent of temperature. Since the voltage at node V400 is applied to the gate terminals of first and second load FETs 300 and 305 which are also biased by a PTAT current, the output conductance $g_{ds}$ of each of the first and second load FETs 300 and 305 are also approximately temperature independent.

In FIG. 6, biasing amplifier 616 is configured with a negative feedback loop, through second replicate FET 605, and a positive feedback loop, through first replicate FET 601. A small positive voltage perturbation on the noninverting input at node V605 of biasing amplifier 616 increases its output voltage at node V400. This increase in voltage on node V400 increases the current sunk by the drain of second replicate FET 605, which decreases the voltage on the noninverting input at node V605 of biasing amplifier 616, thereby completing the negative feedback. However, the increase in voltage on node V400 also increases the current sunk by the drain of first replicate FET 601. As a result, the voltage at both node V600 and the inverting input of biasing amplifier 616 is decreased, thereby completing the positive feedback. The gain of each feedback loop depends on the transconductance $g_m$ of its replicate FET 601, 605. As described in Equation (I), the transconductance $g_m$ of each replicate FET 601, 605 is proportional to the bias current it receives at its drain terminal. Since the second replicate FET 605 receives a larger biasing current at its drain at node V605 from PTAT current source 620 than the current received by first replicate FET 601 at its drain at node V600 from PTAT current source 615, the second replicate FET 605 has a higher transconductance $g_m$ than the first replicate FET 601. As a result, the gain of the negative feedback loop described is greater than the gain of the positive feedback loop described, thereby ensuring a stable operating point.

Figure 7:
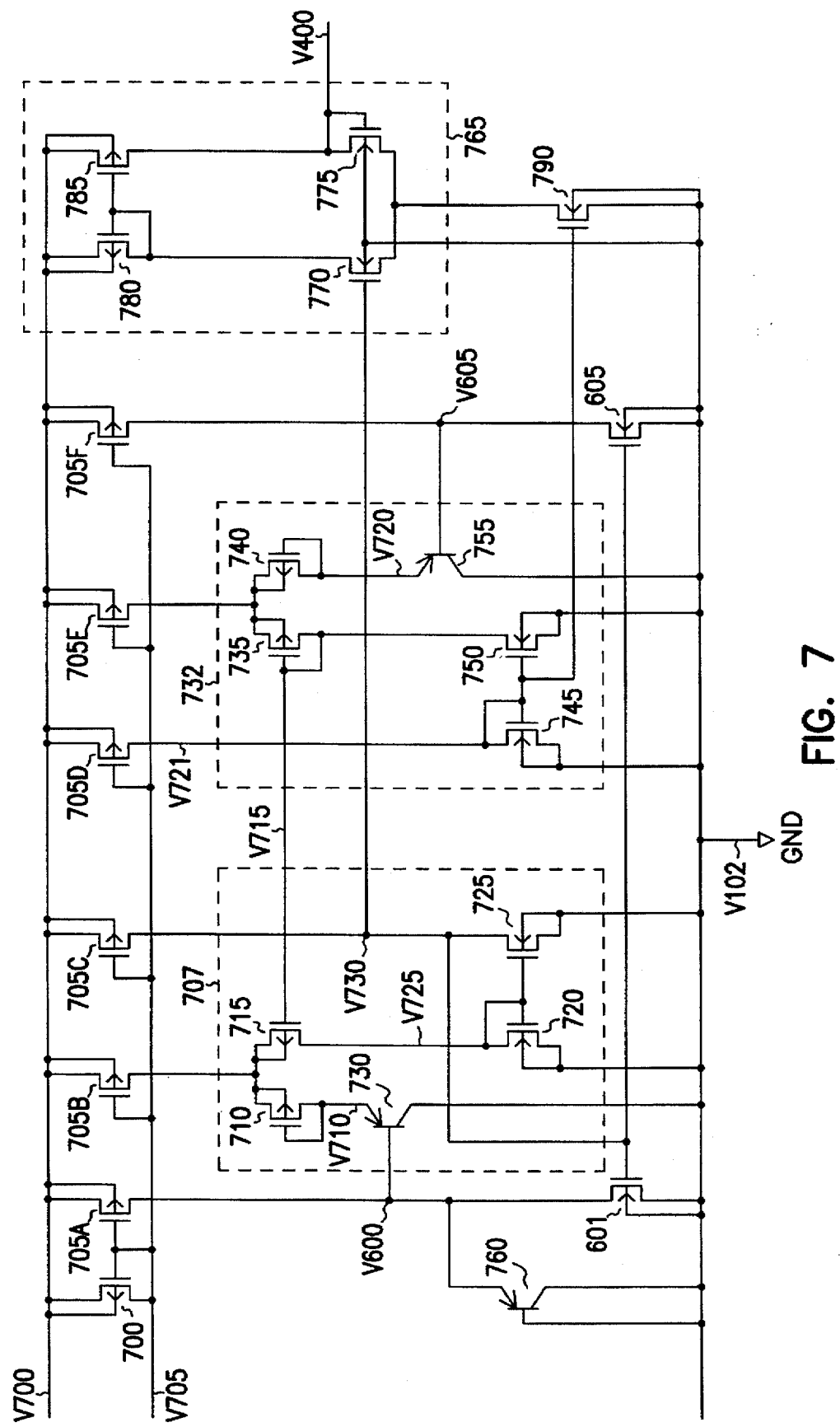
FIG. 7 illustrates a circuit schematic implementation of the differential bias network of FIG. 6.

FIG. 7 illustrates one embodiment of the differential dynamic bias circuit 600 shown generally in FIG. 6, omitting the portion of the integrated circuit amplifier 400. First and second replicate FETs 601 and 605 substantially duplicate load FETs 300 and 305. First and second replicate FETs 601 and 605 each have a source terminal coupled to ground at node V102. First and second replicate FETs 601 and 605 each have a gate terminal coupled at node V730. A PTAT voltage is applied between nodes V600 and V605 which are the drain terminals of first and second replicate FETs 601 and 605 respectively.

In FIG. 7, PMOS FET 700 has a source terminal connected to a power supply voltage at node V700. FET 700 is "diode-connected" by having a drain terminal and a gate terminal coupled at node V705. At node V705, FET 700 sources a PTAT current controlled by a PTAT current sink circuit (not shown). At room temperature, the current sourced by FET 700 at node V705 is approximately 50 nanoamperes. Current mirror FETs 70 5A–F each have a source terminal connected to the power supply voltage at node V700. Current mirror FETs 705A–F each have a gate terminal coupled to the gate terminal of FET 700 at node V705. Current mirror FETs 705A–F supply a PTAT current proportional to the PTAT current sourced by diode-connected FET 700.

In FIG. 6, biasing amplifier 616 and PTAT voltage source 610 were illustrated separately. However, the PTAT voltage source 610 and biasing amplifier 616 may be merged by using an amplifier with a built-in PTAT input offset voltage. The embodiment of FIG. 7 uses two differential input amplifiers 707 and 732, each having built-in PTAT input offset voltages. The input offset voltages of differential amplifiers 707 and 732 are added in series to obtain a larger PTAT voltage between the drain terminal at node V600 of first replicate FET 601 the drain terminal at node V605 of second replicate FET 605.

In FIG. 7, the first differential input amplifier 707 comprises FETs 710, 715, 720, 725, and pnp bipolar junction transistor (BJT) 730. The second differential input amplifier 732 comprises FETs 735, 740, 745, 750, and BJT 755.

In the first differential input amplifier 707 of FIG. 7, input FETs 710 and 715 have their source terminals coupled to each other, and coupled to the drain terminal of current mirror FET 705B which sources a PTAT current. A built-in input offset voltage is obtained by mismatching the physical geometries of input FETs 710 and 715. In one embodiment, the input pair offset voltage is obtained by a parallel connection of multiple identical FETs for each of input FETs 710 and 715 such that more FETs are connected in parallel for input FET 715 than for input FET 710. Since input FET 710 is diode-connected by coupling its drain terminal and its gate terminal, a built-in offset voltage is created between node V710 and node V715 as a result of the mismatched physical geometries. BJT 730 has its emitter terminal connected at node V710 to the drain and gate terminal of input FET 710. The collector terminal of BJT 730 is connected to ground potential at node V102. BJT 730 is operated in a forward active region, resulting in a voltage at a base terminal of BJT 730 at node V600 which is approximately one-half volt lower than the voltage at an emitter terminal of BJT 730 at node V710.

In the second differential input amplifier 732 of FIG. 7, input FETs 735 and 740 have their source terminals coupled to each other and the drain terminal of the current mirror FET 705E. In this embodiment, FETs 735 and 740 each comprise multiple FETs connected in parallel. A built-in offset voltage is obtained by connecting more FETs in parallel for FET 740 than for FET 735. Since each input FET 735 and 740 is diode-connected by coupling the drain terminal and the gate terminal of each individual input FET 735 and 740, a built-in offset voltage is created between nodes V715 and V720. BJT 755 has an emitter terminal coupled to the drain and gate terminals of input FET 740. The collector terminal of BJT 755 is coupled to ground at node V702. BJT 755 is operated in the forward active region, such that the voltage at the base terminal of BJT 755 at node V605 is approximately one-half volt lower than the voltage at the emitter terminal of BJT 755 at node V720. FET 750 is a current source load for input FET 735. FET 750 sinks at its drain terminal a current scaled from the current received at a common drain and gate terminal at node V721 of diode-connected current mirror FET 745. Diode-connected current mirror FET 745 receives at its drain terminal a PTAT current sourced by current mirror FET 705D.

In FIG. 7, the first differential amplifier 707 built-in offset voltage between nodes V710 and V715 is configured in series with the second differential amplifier 732 built in offset voltage between nodes V715 and V720 to create a combined offset voltage between nodes V710 and V720. Substantially equal voltage drops exist between nodes V710 and V600 and nodes V720 and V605 due to substantially equal base-emitter voltage drops of BJT 730 and BJT 755 respectively. Therefore, the combined offset voltage between nodes V710 and V720 is substantially duplicated between nodes V600 and V605.

FETs 710, 715, 735, and 740 are operated in the weak inversion region, producing built-in offset voltages which are proportional to absolute temperature (PTAT). The resulting combined offset voltage between nodes V600 and node V605 is also PTAT. Nodes V600 and V605 are the drain terminals of the first replicate FET 600 and the second replicate FET 605 respectively. Therefore, a PTAT voltage is created between the drain terminals at nodes V600 and V605 of the first and second replicate FETs 601 and 605.

Current mirror FET 705A sources a smaller magnitude PTAT current to first replicate FET 601 than sourced by current mirror FET 705F to second replicate FET 605. As described above for FIG. 6, this creates a temperature insensitive output conductance $g_{ds}$ in the first and second replicate FETs 601 and 605. A common gate terminal at node V730 of the first and second replicate FETs 601 and 605 is controlled by a voltage output from first differential input amplifier 707.

The output voltage of first differential input amplifier 707 is generated as follows. The drain voltage at node V600 of first replicate FET 601 is fed to the gate terminal at node V710 of input FET 710 through the base-emitter junction of BJT 730. The gate terminal voltage at V710 of FET 710 is approximately one half volt higher than the voltage at node V600 due to the voltage drop across the base-emitter junction of BJT 730. The drain voltage at node V605 of second replicate FET 605 is increased by approximately one half volt at node V720 by the base-emitter junction voltage of BJT 755. The voltage at node V720 is fed to the gate terminal of input FET 740. The voltage at node V720 is offset by second differential amplifier 732 PTAT built-in input offset voltage produced by the gate-to-source voltages of diode-connected FETs 740 and 735 respectively.

Negative feedback producing a stable operating point is described as follows. A voltage applied at the gate terminal at node V715 of input FET 715 which is more positive than the voltage at the gate terminal at node V710 by more than a built-in PTAT input offset voltage of amplifier 707 causes a decrease in the current sourced by FET 715 at its drain terminal at node V725. This causes a decrease in voltage at the common drain and gate terminals at node V725 of diode-connected FET 720. The current sunk at the drain terminal of FET 725 is controlled by the voltage at its gate terminal at node V725. The decrease in voltage at node V725 causes a decrease in the current sunk at the drain terminal of FET 725. This causes the voltage at node V730 to increase. Since the voltage at node 730 is coupled to the gate terminal of FET 605, this increases the current sunk at the drain terminal of FET 605. The increased current sunk at the drain terminal of FET 605 causes the voltage at node V605 to decrease. Since the voltage at node V605 is fed to node V715 as described above, the voltage at node V715 also decreases, completing the negative feedback and producing a stable operating point. As described above with respect to FIG. 6, a positive feedback loop also exists through first replicate FET 601. As shown previously, since the second replicate FET 605 receives a higher biasing current at its drain terminal at node V605 than received by the first replicate FET 601 at its drain terminal at node V600, the gain of the negative feedback loop is higher than the gain of the positive feedback loop, thereby ensuring a stable operating point. BJT 760 provides a startup function to ensure the stable operating point is reached when power is supplied to the circuit.

In FIG. 7, the varying voltage at node V730, the common gate terminal of the first and second replicate FET, is buffered through unity gain follower amplifier 765 to produce the varying bias voltage at node V400 which is applied to the first and second load FETs 300 and 305 of the amplifier of FIG. 6. Unity gain follower amplifier 765 is a common-source differential amplifier comprising input FETs 770 and 775 and current mirror load FETs 780 and 785. Unity gain follower amplifier 765 is biased by current source FET 790, which sinks at its drain terminal a current scaled from diode-connected current mirror FET 745. The approximately temperature independent input bias voltage at node V730 is substantially duplicated at node V400 by unity gain follower amplifier 765. However, the voltage at node V730 has a lower output impedance than that produced at node V730 by first differential input amplifier 707. The reduced output impedance provided by unity gain follower amplifier 765 enables the approximately temperature independent bias circuit of FIG. 7 to supply an approximately temperature independent bias voltage at node V400 to multiple unrelated independent circuit blocks. With the lowered output impedance provided by unity gain follower amplifier 765, the effect of capacitive noise voltages introduced at node V400 by a particular independent circuit block is minimized, thereby preserving the integrity of the approximately temperature independent reference voltage for use by other circuit blocks.

It is seen that FIG. 7 represents one possible embodiment of a differential dynamic bias circuit. Other embodiments of modifications to the embodiment of FIG. 7 may be made without altering the inventive concept disclosed herein. For example, input FETs 710, 715, 735, and 740 may be replaced by BJTs, which may also implement a PTAT built-in offset voltage. Although the embodiment of FIG. 7 has two differential input amplifiers 707 and 732 to implement two built-in offset voltages coupled in series to create a larger built-in offset voltage, a single differential input amplifier can also implement a PTAT built-in offset voltage. Other circuits could also be used to produce a PTAT voltage between the drain of the first replicate FET 601 and the drain of the second replicate FET 605.

Figure 8:
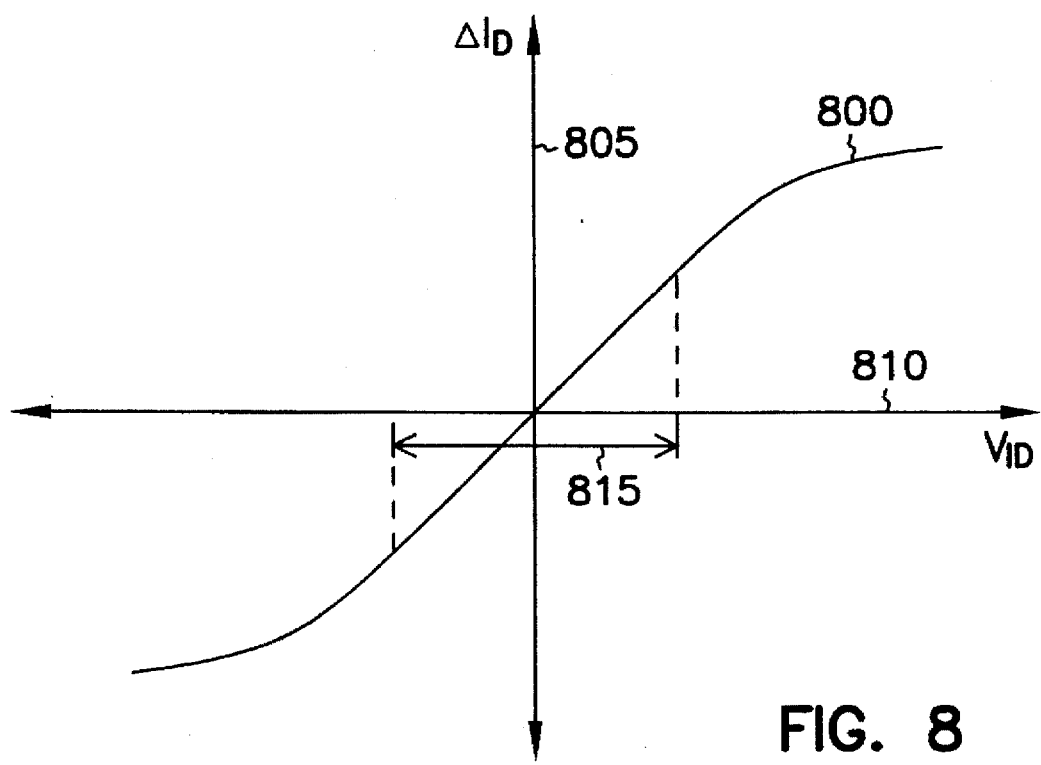
FIG. 8 illustrates the transconductance curve obtained from the input FETs of a differential amplifier by plotting differential drain current vs. differential input voltage.

The present invention also advantageously uses nonlinearity in the output conductance $g_{ds}$ of the first and second load FETs 300 and 305 to offset nonlinearity in the transconductance $g_m$ of the first and second input FETs 100 and 105 to improve the overall linearity of the voltage signal amplification. FIG. 8 illustrates the transconductance curve 800 obtained by plotting the differential current 805 sourced at the drains of first and second input FETs 100 and 105 vs. the differential input voltage 810 at the gate terminals at nodes V105 and V110 of the first and second input FETs 100 and 105 respectively. The transconductance curve is substantially linear, with slope equal to the transconductance $g_m$, over a linear differential input voltage range 815 of approximately 50 mV with reduced gain outside the linear differential input voltage range due to the curvature of transconductance curve 800.

Figure 9:
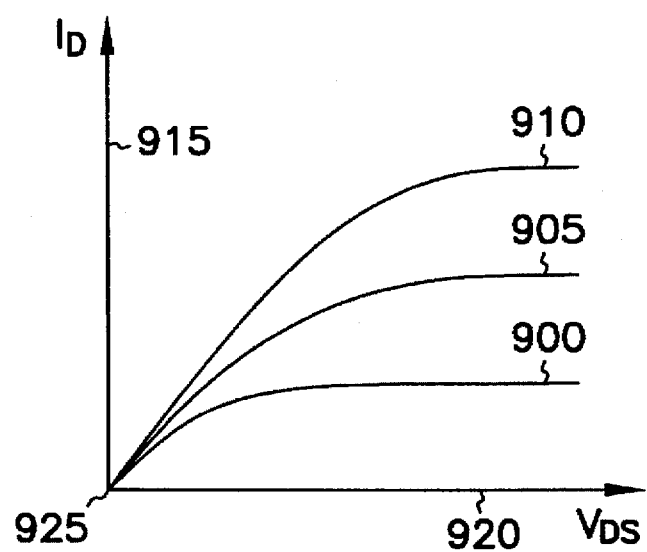
FIG. 9 illustrates the output conductance curve obtained from the load FETs of a differential amplifier by plotting drain current vs. drain-to-source voltage.

FIG. 9 illustrates the output conductance curves 900, 905, and 910 obtained by plotting the drain current 915 of one of first and second load FETs 300 and 305 against the drain to source voltage 920 of the same one of first and second load FETs 300 and 305. The gate voltage applied at node V400 is higher for curve 910 than for curve 905, and higher for curve 905 than for curve 900. Each of the output conductance curves 900, 905, and 910 is substantially linear near the origin 925 of the graph of FIG. 9, with a slope equal to $g_{ds}$. For a given drain current 915 received at the drain terminal of one of first and second load FET 300 and 305, a voltage at the gate terminal at node V400 can be supplied by the circuit of FIG. 7 to determine the output conductance curve 900, 905, 910 on which the amplifier operates. The voltage at node V400 can be adjusted by adjusting the biasing conditions and physical sizes of first and second replicate FETs 601 and 605 of the dynamic bias circuit disclosed by the present invention.

Thus, the circuit of FIG. 7 can advantageously be implemented to pick an output conductance curve 900, 905, 910 having curvature which approximately matches the curvature of the transconductance curve 800. Since the gain of the amplifier depends on the ratio of the transconductance $g_m$ of one of the first and second input FETs 100 and 105 to the output conductance $g_{ds}$ of one of the first and second load FETs 300 and 305, the matched curvatures produce a more linear amplifier voltage gain over a wider input voltage range.

It can be seen that the present invention implements a low-power, low-noise amplifier with well-controlled and linear voltage gain, high input-impedance, and wide dynamic range, suitable as a preamplifier to a signal processing system, such as a switched-capacitor filter, and for amplification of the electrical signals in the heart produced by atrial depolarization.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the electrical, computer, and telecommunications arts will readily appreciate that the present invention may be implemented in a very wide variety of embodiments. This application is intended to cover any adaptations or variations of the preferred embodiment discussed herein. Therefore, it is manifestly intended that this invention be limited only by the claims and the equivalents thereof.

What is claimed is:

1. An integrated circuit amplifier comprising:
    a differential pair of input field-effect transistors (FETs) receiving a differential input voltage signal having a first input signal component and a second input signal component and providing in response thereto a differential output voltage signal having a first output signal component and a second output signal component, the differential pair of input FETs including:
        a first input FET having a source terminal, a gate terminal receiving the first input signal component, and a drain terminal providing the first output signal component, and
        a second input FET having a source terminal coupled to the source terminal of the first input FET, a gate terminal receiving the second input signal component, and a drain terminal providing the second output signal component;
    a first load FET having a source terminal, a gate terminal, a drain terminal coupled to the drain terminal of the first input FET, and a controlled conductance between the drain terminal and the source terminal;
    a second load FET having a source terminal coupled to the source terminal of the first load FET, a gate terminal coupled to the gate terminal of the first load FET, a drain terminal coupled to the drain terminal of the second input FET, and a controlled conductance between the drain terminal and the source terminal; and
    a dynamic bias circuit coupled to the gate terminals of the first and second load FET for keeping the first load FET and the second load FET in a nonsaturation region and for controlling the conductance between the drain terminal and the source terminal of each of the first and second load FETs by applying a varying bias voltage to the gate terminals of each of the first and second load FETs.

2. The amplifier of claim 1, wherein each input FET comprises a p-channel metal-oxide-semiconductor (PMOS) FET.

3. The amplifier of claim 1, wherein electronic noise contributed by the first and second load FETs is substantially negligible relative to electronic noise contributed by the first and second input FETs.

4. The amplifier of claim 1, wherein the input FETs are biased in a weak inversion region of operation.

5. The amplifier of claim 1, wherein the differential output voltage signal represents an approximate linear amplification of the differential input voltage signal for the differential input voltage signal of up to a selected differential input voltage signal magnitude.

6. The amplifier of claim 5, wherein the selected differential input voltage signal magnitude is approximately 30 mV.

7. The amplifier of claim 1, wherein the amplifier provides an approximately temperature independent voltage gain from the differential input voltage signal to the differential output voltage signal.

8. The amplifier of claim 1, wherein the amplifier is capable of providing an approximately temperature independent voltage gain from the differential input voltage signal to the differential output voltage signal of approximately 8.3.

9. The amplifier of claim 1, wherein the controlled load conductance between the drain terminal and the source terminal of each of the first and second load FETs has a temperature dependence which is closely matched to a temperature dependence of the corresponding differential input FET to which the drain terminal of the load FET is coupled.

10. The amplifier of claim 1, wherein the controlled conductance between the drain terminal and the source terminal of each of the first and second load FETs has a bias current dependence which is closely matched to a bias current dependence of a transconductance of the corresponding differential input FET to which the drain terminal of the load FET is coupled.

11. The amplifier of claim 1, wherein nonlinearity in differential transconductance of the differential input FETs is reduced by nonlinearity in the controlled conductance between the drain terminal and the source terminal of the first and second load FETs.

12. The amplifier of claim 1, wherein the dynamic bias circuit comprises:
    a replicate FET having a source terminal coupled to the source terminals of the first and second load FETs, a gate terminal coupled to the gate terminals of each of the first and second load FETs, and a drain terminal, wherein a proportional to absolute temperature (PTAT) current is received at the drain terminal of the replicate FET and the replicate FET is operated in the nonsaturation region; and
    a PTAT voltage generator circuit for coupling a PTAT voltage between the drain terminal and the source terminal of the replicate FET and for applying a biasing voltage at the gate terminal of the replicate FET, wherein the biasing voltage at the gate terminal of the replicate FET is provided to the gate terminal of each of the first and second load FETs.

13. The amplifier of claim 12, wherein the replicate FET of the dynamic bias circuit is closely matched to each of the first and the second load FETs.

14. The amplifier of claim 1, where the dynamic bias circuit comprises:
   a first replicate FET having a source terminal coupled to the source terminal of each of the first and second load FETs, a gate terminal coupled to the gate terminal of each of the first and second load FETs, and a drain terminal, wherein a PTAT current is received at the drain terminal of the first replicate FET, and the first replicate FET is operated in the nonsaturation region;
   a second replicate FET having a source terminal coupled to the source terminal of each of the first and second load FETs, a gate terminal coupled to the gate terminal of each of the first and second load FETs and coupled to the gate terminal of the first replicate FET, and a drain terminal, wherein a PTAT current is received at the drain terminal of the second replicate FET, and wherein the PTAT current received at the drain terminal of the second replicate FET differs in magnitude from the PTAT current received at the drain terminal of the first replicate FET, and the second replicate FET is operated in the nonsaturation region; and
   a PTAT voltage generator circuit for applying a differential PTAT voltage between the drain terminal of the first replicate FET and the drain terminal of the second replicate FET and applying a biasing voltage at the gate terminal of the first replicate FET and the gate terminal of the second replicate FET coupled thereto, wherein the biasing voltage at the gate terminal of the first replicate FET and the gate terminal of the second replicate FET coupled thereto is provided to the gate terminal of the load FETs.

15. The amplifier of claim 14, wherein the first replicate FET and the second replicate FET are closely matched to each load FET.

16. A method of signal amplification using a differential amplifier including first and second differential input FETs coupled at common source terminals, each of the first and second differential input FETs having a gate terminal, the differential amplifier further including first and second load field-effect transistors (FETs) coupled at common gate terminals and common source terminals, the first and second load FETs each having a drain terminal coupled to a corresponding drain terminal of first and second input FETs respectively, the method comprising the steps of:
   receiving a differential input voltage signal between the gate terminals of each of the first and second input FETs;
   amplifying the differential input voltage signal by a linear amplification voltage gain resulting in a differential output voltage signal, the linear amplification voltage gain varying with temperature according to a temperature sensitivity; and
   biasing the common gate terminals of the first and second load FETs with a varying bias voltage to reduce the temperature sensitivity of the linear amplification voltage gain.

17. The method of claim 16, wherein the step of receiving the differential input voltage signal between the gate terminals of each of the first and second input FETs is performed by PMOS input FETs.

18. The method of claim 16, further comprising the step of biasing the input FETs in a weak inversion region.

19. The method of claim 16, wherein the step of biasing the common gate terminals of the first and second load FETs includes the step of biasing the load FETs in a nonsaturation region.

20. The method of claim 16, wherein the amplifier further comprises a biasing network having a replicate FET which duplicates the first and second load FETs, and wherein the step of biasing the common gate terminals of the first and second load FETs with a varying bias voltage includes the steps of:
   biasing the replicate FET in the nonsaturation region;
   receiving a proportional to absolute temperature (PTAT) voltage between a drain terminal and a source terminal of the replicate FET;
   receiving a PTAT bias current at the drain terminal of the replicate FET; and
   forming a resulting biasing voltage output at a gate terminal of the replicate FET to provide the varying input bias voltage at the common gate terminals of the first and second load FETs.

21. The method of claim 16, wherein the amplifier further comprises a biasing network having first and second replicate FETs duplicating the first and second load FETs, and wherein the first and second replicate FETs have common gate terminals coupled to the common gate terminals of the first and second load FETs, and wherein the step of biasing the common gate terminals of the first and second load FETs with a varying bias voltage includes the steps of:
   biasing the first and second replicate FETs in the nonsaturation region;
   applying a differential proportional to absolute temperature (PTAT) voltage between a drain terminal of the first replicate FET and a drain terminal of the second replicate FET;
   receiving a first PTAT current at the drain terminal of the first replicate FET;
   receiving at the drain terminal of the second replicate FET a second PTAT current of different magnitude than the first PTAT current; and
   forming a resulting biasing voltage output at the common gate terminals of the first and second replicate FETs to provide the varying bias voltage at the common gate terminals of the first and second load FETs.

22. A cardiac rhythm management system, comprising:
   at least one sensing electrode for sensing electrical depolarization signals produced by a heart;
   an amplifier having first and second input ports coupled to the sensing electrode and receiving the sensed electrical depolarization signals as a differential input voltage signal between the first and second input ports, the differential input voltage signal having a first input signal component at the first input port and a second input signal component at the second input port, and the amplifier providing in response thereto a differential output voltage signal having a first output signal component and a second output signal component, the amplifier comprising:
      a first input field-effect transistor (FET) having a source terminal, a gate terminal coupled to the first input port and receiving the first input signal component, and a drain terminal providing the first output signal component;
      a second input FET having a source terminal coupled to the source terminal of the first input FET, a gate terminal receiving the second input signal component, and a drain terminal providing the second output signal component;
      a first load FET having a source terminal, a gate terminal, a drain terminal coupled to the drain terminal of the first input FET, and a controlled conductance between the drain terminal and the source terminal;

a second load FET having a source terminal coupled to the source terminal of the first load FET, a gate terminal coupled to the gate terminal of the first load FET, a drain terminal coupled to the drain terminal of the second input FET, and a controlled conductance between the drain terminal and the source terminal; and a dynamic bias circuit coupled to the gate terminals of the first and second load FETs for keeping the first load FET and the second load FET in a nonsaturation region and for controlling the conductance between the drain terminal and the source terminal of each of the first and second load FETs by applying a varying bias voltage to the gate terminals of each of the first and second load FETs.

23. The cardiac rhythm management system of claim 22, wherein the sensed electrical depolarization signals produced by the heart include electrical depolarization signals produced by an atrial chamber of the heart.

24. The cardiac rhythm management system of claim 22, wherein the cardiac rhythm management system is capable of being implanted in either a human or animal.

* * * * *